United States Patent

Doan

[11] Patent Number: 5,536,606
[45] Date of Patent: Jul. 16, 1996

[54] METHOD FOR MAKING SELF-ALIGNED RIM PHASE SHIFTING MASKS FOR SUB-MICRON LITHOGRAPHY

[75] Inventor: Trung T. Doan, Boise, Id.

[73] Assignee: Micron Technology, Inc., Boise, Id.

[21] Appl. No.: 452,727

[22] Filed: May 30, 1995

[51] Int. Cl.⁶ .................................................. G03F 9/00
[52] U.S. Cl. .............................. 430/5; 430/323; 430/324; 430/326
[58] Field of Search .................... 430/5, 323, 324, 430/326

[56] References Cited

U.S. PATENT DOCUMENTS

| | | | |
|---|---|---|---|
| 5,045,417 | 9/1991 | Okamoto | 430/5 |
| 5,079,113 | 1/1992 | Ohta et al. | 430/5 |
| 5,126,220 | 6/1992 | Tokitomo et al. | 430/5 |
| 5,194,344 | 3/1993 | Cathey et al. | 430/5 |
| 5,194,345 | 3/1993 | Rolfson et al. | 430/5 |
| 5,194,346 | 3/1993 | Rolfson et al. | 430/5 |
| 5,208,125 | 5/1993 | Lowrey et al. | 430/5 |
| 5,217,830 | 6/1993 | Lowrey | 430/5 |
| 5,240,796 | 8/1993 | Lee et al. | 430/5 |
| 5,255,035 | 7/1993 | Rolfson | 156/643 |
| 5,281,500 | 1/1994 | Cathey et al. | 430/5 |
| 5,288,568 | 2/1994 | Cathey, Jr. | 430/5 |
| 5,290,647 | 3/1994 | Miyazaki et al. | 430/5 |
| 5,318,868 | 6/1994 | Hasegawa et al. | 430/5 |
| 5,405,721 | 4/1995 | Pierrat | 430/5 |
| 5,411,824 | 5/1995 | Vasudev et al. | 430/5 |

OTHER PUBLICATIONS

Lin, Burn J., "Phase Shifting and Other Challenges in Optical Mask Technology", IBM–EF–15 (Sep. 26, 1990).

*Primary Examiner*—S. Rosasco
*Attorney, Agent, or Firm*—Stephen A. Gratton

[57] ABSTRACT

A method for making self aligned rim phase shifting masks for photolithography is provided. The method includes providing a transparent substrate (e.g., quartz) having a patterned opaque layer (e.g., chrome) and then forming phase shifters at the rim or edges of the features defined by the opaque layer. The phase shifters are formed by depositing two different layers of transparent material (e.g., $Si_3N_4$/$SiO_2$) over the substrate and opaque layer. The first layer of material is a spacer layer which accurately spaces the rim phase shifters from the feature. The second layer of material is a phase shifter layer that forms the bulk of the rim phase shifters. Following deposition both layers are planarized to expose the spacer layer. The spacer layer is then selectively etched with respect to the phase shifter layer. This is followed by another etch of the phase shifter layer to form the rim phase shifters.

20 Claims, 3 Drawing Sheets

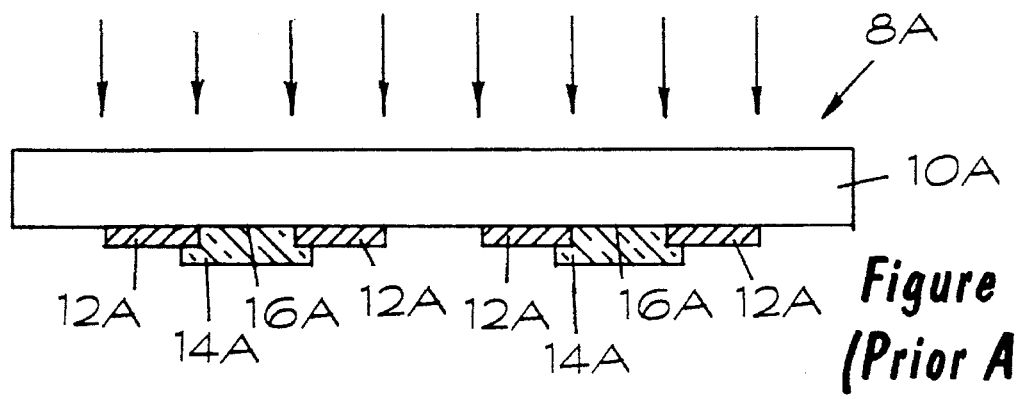
Figure 1A
(Prior Art)
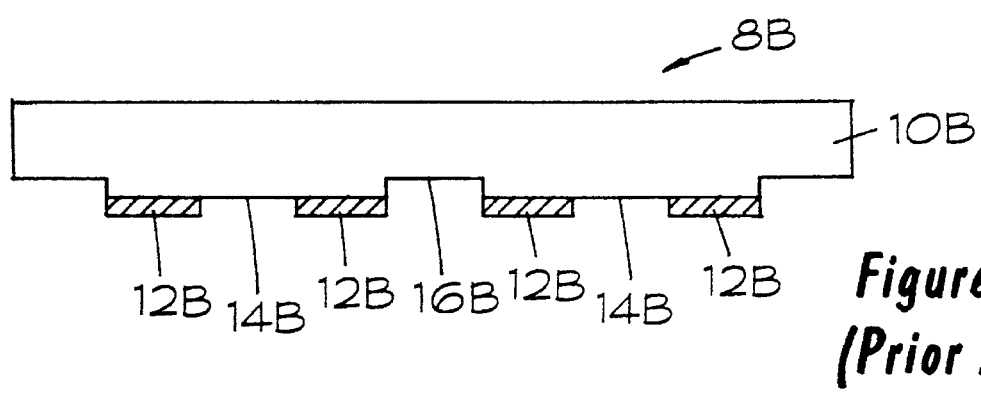
Figure 1B
(Prior Art)
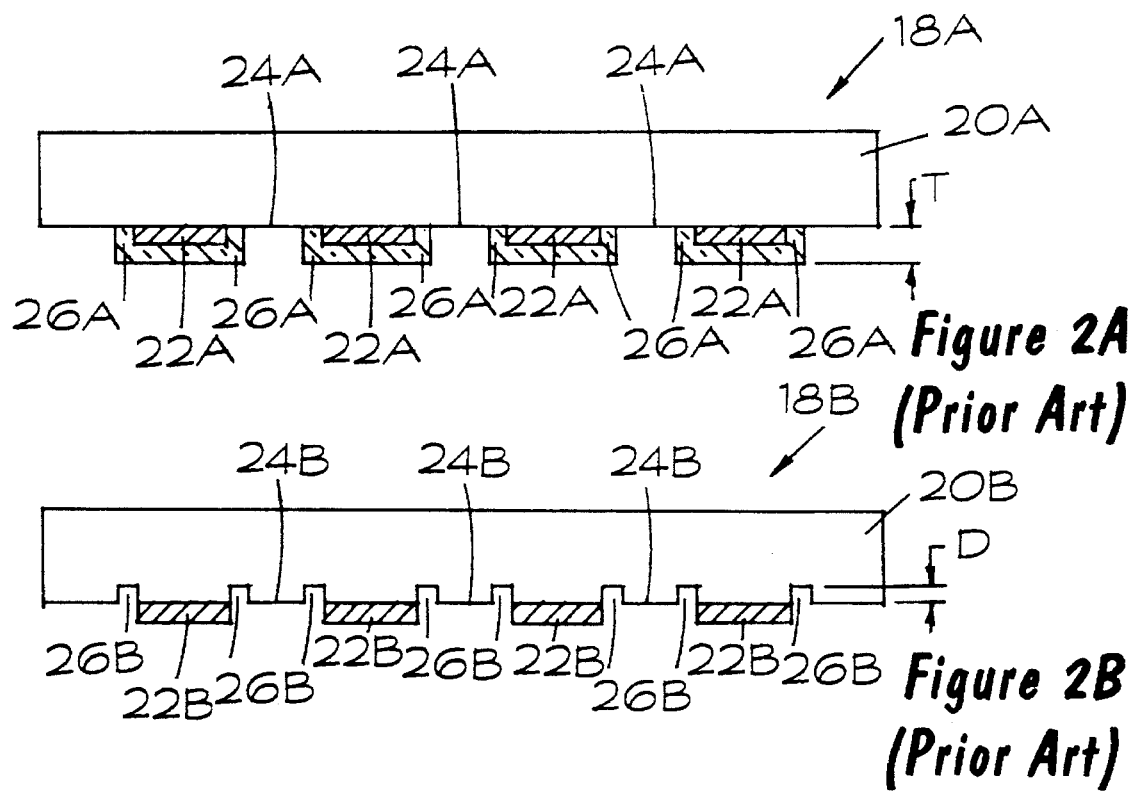
Figure 2A
(Prior Art)
Figure 2B
(Prior Art)

METHOD FOR MAKING SELF-ALIGNED RIM PHASE SHIFTING MASKS FOR SUB-MICRON LITHOGRAPHY

FIELD OF THE INVENTION

This relates to optical lithography and more particularly to the fabrication of masks or reticles which are used in optical lithography. The method of the invention is particularly suited to the fabrication of phase shifting masks for semiconductor manufacture.

BACKGROUND OF THE INVENTION

In semiconductor manufacture, micro lithography is used in the formation of integrated circuits on a semiconductor wafer. During a lithographic process, a form of radiant energy such as ultraviolet light, is passed through a mask or reticle and onto the semiconductor wafer. The mask contains opaque and transparent regions formed in a predetermined pattern. A grating pattern, for example, may be used to define parallel spaced conducting lines on a semiconductor wafer. The ultraviolet light exposes the mask pattern on a layer of resist formed on the wafer. The resist is then developed for removing either the exposed portions of resist for a positive resist or the unexposed portions of resist for a negative resist. The patterned resist can then be used during a subsequent semiconductor fabrication process such as ion implantation or etching.

As microcircuit densities have increased, the size of the features of semiconductor devices have decreased to the sub micron level. These sub micron features may include the width and spacing of metal conducting lines or the size of various geometric features of active semiconductor devices. The requirement of sub micron features in semiconductor manufacture has necessitated the development of improved lithographic processes and systems. One such improved lithographic process is known as phase shift lithography.

With phase shift lithography the interference of light rays is used to overcome diffraction and improve the resolution and depth of optical images projected onto a target. In phase shift lithography, the phase of an exposure light at the object is controlled such that adjacent bright areas are formed preferably 180 degrees out of phase with one another. Dark regions are thus produced between the bright areas by destructive interference. This technique improves total resolution at the object and allows resolutions as fine as 0.10 μm to occur.

In general, a phase shifting photomask is constructed with a repetitive pattern formed of three distinct layers or areas. An opaque layer provides areas that allow no light transmission, a transparent layer provides areas which allow close to 100% of light to pass through and a phase shift layer provides areas which allow close to 100% of light to pass through but phase shifted 180 degrees from the light passing through the transparent areas. The transparent areas and phase shift areas are situated such that light rays diffracted through each area is canceled out in a darkened area there between. This creates the pattern of dark and bright areas which can be used to clearly delineate features of a pattern defined by the opaque layer of the mask on a photopatterned semiconductor wafer.

Recently, different techniques have been developed in the art for fabricating different types of phase shifting photomasks. One type of phase shifting mask, named after a pioneer researcher in the field, M. D. Levenson, is known in the art as a "Levenson" phase shifting mask. This type of mask is also referred to as an "alternating aperture" phase shifting mask because opaque light blockers alternate with light transmission apertures and every other aperture contains a phase shifter.

This type of mask is typically formed on a transparent quartz substrate. An opaque layer, formed of a material such as chromium, is deposited on the quartz substrate and etched with openings in a desired pattern. Phase shift areas on the mask are formed by depositing a phase shift material over the opaque layer and into every other opening in the opaque layer. This is termed an "additive" phase shifting mask. Alternately, phase shift areas of the mask may be formed in areas of the quartz substrate having a decreased thickness. This is termed a subtractive phase shifting mask.

Two types of Levenson phase shifting photomasks are shown in FIGS. 1A and 1B. FIG. 1A shows an additive phase shifting mask 8A comprising a transparent substrate 10A and an opaque layer 12A having a pattern of etched openings 16A. The phase shifters 14A for the phase shifting mask 8A are formed as segments of a light transmissive material, such as $SiO_2$, deposited in every other opening 16A in the opaque layer 12A.

FIG. 1B shows a subtractive phase shifting mask 8B. In a subtractive phase shifting mask 8B, the phase shifters 14B are formed by etching the substrate 10B aligned with every other opening 16B in the opaque layer 12B. In the subtractive phase shifting mask 8B, the unetched portions of the substrate form the phase shifters 14B. Although the additive and subtractive phase shifting masks are fabricated by different methods, the operation of these masks is equivalent.

Another type of phase shifting mask is known as a rim phase shifting mask. A rim phase shifting mask includes phase shifters that are formed on the edges of the opaque light blocking elements. A rim phase shifting mask can also be made using an additive process or a subtractive process.

In FIG. 2A, a rim phase shifting mask 18A is formed by an additive process and includes a transparent substrate 20A, opaque light blockers 22A and light transmissive openings 24A. Rim phase shifters 26A are formed on the edges of the features defined by the opaque light blockers 22A. The rim phase shifters 26A are formed by depositing a layer of a transparent material such as silicon dioxide ($SiO_2$) to a predetermined thickness.

In use of the rim phase shifting mask 18A, the light passing through a rim phase shifter 26A is phase shifted relative to the light passing through a light transmission opening 24A. This is because the light passing through a rim phase shifter 26A must pass through a thicker section of the transparent phase shift material. The phase shifted light forms a null on the wafer that corresponds to the edges of the opaque light blockers 22A. This overcomes the effects of diffraction along the edges of the opaque light blockers 22A and produces a sharpened image.

The thickness "t" of the rim phase shifters 26A is selected to achieve a phase shift of 180° ($\pi$) or an odd whole multiple of 180°. This thickness "t" can be determined using the formula:

$$t = i\lambda/2(n-1)$$

where
t=thickness of rim phase shifters
i=an odd integer
$\lambda$=wavelength of exposure light n=refractive index of phase shift material at the exposure wavelength.

FIG. 2B illustrates a rim phase shifting mask 18B formed using a subtractive process. The rim phase shifting mask 18B includes a transparent substrate 20B, opaque light blockers 22B and light transmissive openings 24B. Rim phase shifters 26B are formed on the edges of the opaque light blockers 22B by etching the substrate 20B to a depth of "d". The depth "d" corresponds to the thickness "t" in the above formula.

One problem that occurs in the manufacture of rim phase shifting masks is that it is difficult to align the rim phase shifters to the edges of the features. This is because different photomasks are required to form the opaque light blockers and the rim phase shifters. These two different photomasks can be difficult to accurately align at the submicron feature sizes required by VLSI and ULSI semiconductor manufacture. In addition, it is sometimes difficult to control the thickness "t" or depth "d" of the rim phase shifters.

In view of the foregoing, it is an object of the present invention to provide an improved method for fabricating phase shifting masks for semiconductor manufacture. It is a further object of the present invention to provide an improved method for fabricating rim phase shifting masks in which rim phase shifters are self-aligned with the edges of an opaque light blocker. It is yet another object of the present invention to provide an improved method for fabricating rim phase shifting masks that is simple, low cost and adaptable to large scale semiconductor manufacture.

Other objects, advantages and capabilities of the present invention will become more apparent as the description proceeds.

SUMMARY OF THE INVENTION

In accordance with the present invention, an improved method of forming a rim phase shifting mask is provided. The method includes depositing two different layers over opaque light blockers formed on a transparent substrate. A spacer layer determines the location of the rim phase shifters with respect to the opaque light blockers. A phase shifter layer forms the rim phase shifters. Following deposition, both layers are planarized to expose the spacer layer of the sidewalls of the opaque light blockers. The spacer layer is then etched selective to the phase shifter layer. This forms a gap which ultimately spaces the rim phase shifters a predetermined distance from the edges of the opaque light blocker. Next an etch process is used to etch the phase shifters out of the phase shifter layer with a desired width and height.

The spacer and phase shifter layers are formed of transparent materials that can be etched selective to one another. As an example, the spacer layer can be formed of silicon nitride ($Si_3N_4$) and the phase shifter layer formed of silicon dioxide ($SiO_2$). Other materials that can be used for either of these layers include $AlO_2$, $TiO_2$, TEOS, PMMA, doped glass, and other ceramic materials.

The method of the invention, broadly stated, includes the steps of: providing a transparent substrate; forming opaque light blockers on the substrate with light transmissive openings therebetween; depositing a transparent spacer layer on the substrate and over the light blockers to a predetermined thickness; depositing a transparent phase shifter layer on the spacer layer; planarizing the layers to expose the spacer layer along the sidewalls of the opaque light blockers; etching the spacer layer selective to the phase shifter layer to form a gap; and then etching the phase shifter layer to form rim phase shifters of a desired width, height and spacing from the edges of the opaque light blockers.

BRIEF DESCRIPTION OF THE DRAWINGS

FIG. 1A is a schematic cross sectional view of a prior art alternating aperture phase shifting mask fabricated using an additive process;

FIG. 1B is a schematic cross sectional view of a prior art alternating aperture phase shifting mask fabricated using a subtractive process;

FIG. 2A is a schematic cross sectional view of a prior art rim phase shifting mask fabricated using an additive process;

FIG. 2B is a schematic cross sectional view of a prior art rim phase shifting mask fabricated using a subtractive process;

DETAILED DESCRIPTION OF PREFERRED EMBODIMENTS

Referring now to FIGS. 3A–3F, the steps involved in fabricating a phase shifting photomask in accordance with the method of the invention are shown.

Figure 3A:
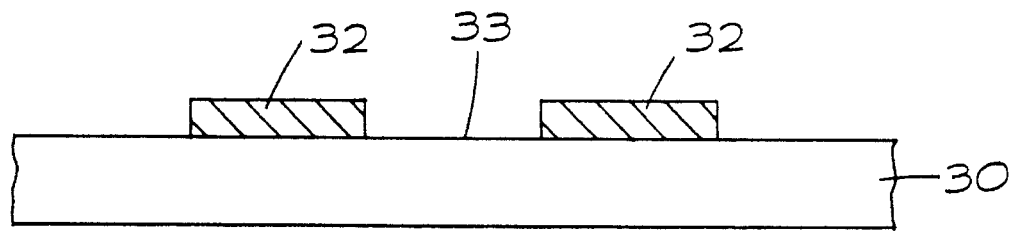
FIGS. 3A–3F are schematic cross sectional views illustrating a method for forming a rim phase shifting mask in accordance with the invention.

As shown in FIG. 3A, a transparent substrate 30 is provided. The substrate 30 can be formed of any transparent material having suitable optical and mechanical properties. Quartz is favored for the substrate 30 because it is highly transparent and is not affected by temperature variations that may produce pattern distortions during the photolithography exposure and alignment steps.

Initially, an opaque layer is deposited on the substrate and is patterned and etched in a desired pattern of opaque light blockers 32 and light transmission openings 33. The features of a pattern are defined by the opaque light blockers 32 and light transmission openings 33.

The opaque layer for forming the opaque light blockers 32 can be a metallized layer of a material such as chromium, aluminum, tungsten, gold, iron oxide, molybdenum as well as other metals and alloys of the above metals. These metals are opaque to most exposing wavelengths used in photolithography and are characterized by mechanical properties that are suitable for plating (e.g., sputtering, CVD, EBD).

Advantageously, the quartz substrate 30 and opaque light blockers 32 can be formed from a photolithographic mask blank in a separate manufacturing process. Such a mask blank is known in the art as a standard binary mask blank. The thickness of the opaque layer for a standard mask blank will typically be on the order of about 800–1200 Å. The opaque layer can then be patterned and etched to form a desired pattern of opaque light blockers 32 and light transmission openings 33.

Figure 3B:
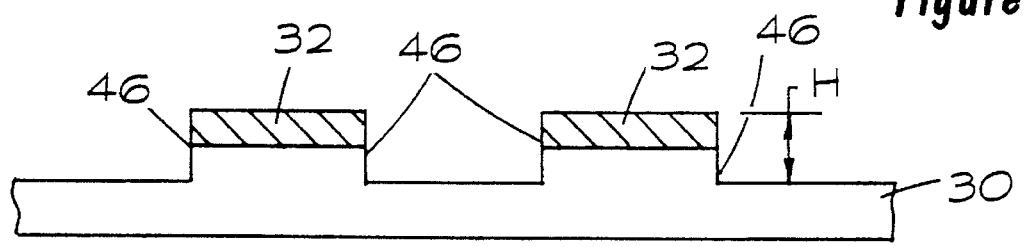

Next, as shown in FIG. 3B, the substrate 30 is isotropically etched to form vertical sidewalls 46. The vertical portion of the etched substrate and the coplanar sidewalls of the opaque light blockers 32. A substrate 30 formed of quartz can be isotropically etched using a fluorine based etching species such as $SF_6$, $CF_4$ or $CHF_3$. Other etching species besides fluorine based gases that are suitable for dry etching quartz can also be utilized. The etching species for etching the substrate 30, however, must be selected to not attack the opaque light blockers 32. In FIG. 3B, the height "H" of the sidewalls 46 is the distance from the exposed top surface of the opaque light blockers 32 to the exposed top surface of the substrate 30.

Figure 3C:
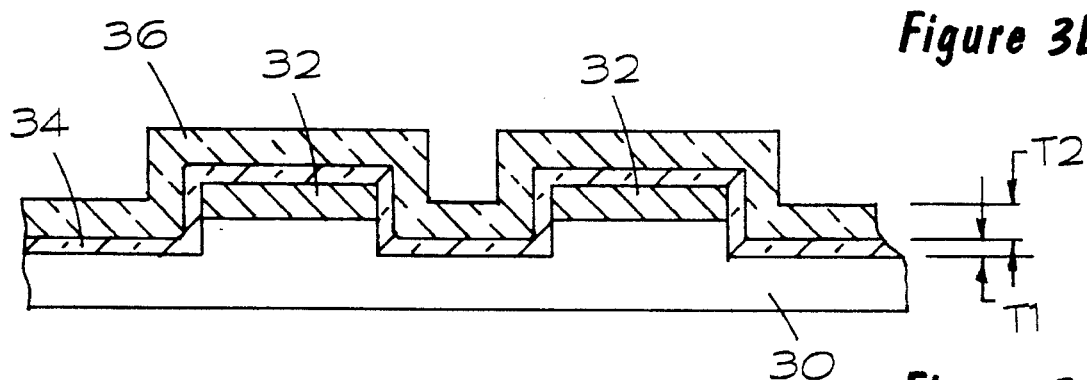

Next, as shown in FIG. 3C, a spacer layer 34 is conformally deposited over the substrate 30, over the opaque light blockers 32 and over the sidewalls 46 formed by the etched substrate and opaque light blockers 32. The spacer layer 34 can be deposited by a process such as chemical vapor deposition (CVD) or evaporation. The spacer layer can be any material that is transparent in the UV and deep UV regions where most photolithographic processes are performed. In addition, the spacer layer 34 must be selectively etchable with respect to a phase shifter layer 36 that is subsequently deposited. Suitable materials for the spacer layer 34 include silicon dioxide ($SiO_2$) and silicon nitride ($Si_3N_4$). Other suitable materials include $AlO_2$, $TiO_2$, TEOS (tetraethylorthosilicate), doped glass, $CaF_2$, $MgF_2$, and PMMA (polymethyl methacrylate). These same materials are suitable for forming the phase shifter layer 36 as long as the spacer layer is selected to be selectively etchable with respect to the phase shifter layer 36.

The spacer layer 34 is deposited to a thickness of T1. This spacing can be accurately controlled using standard deposition processes. As will become apparent as the description proceeds, the thickness T1 determines a spacing of the subsequently formed phase shifters.

As also shown in FIG. 3C, a phase shifter layer 36 is conformally deposited over the spacer layer 34 to a thickness of T2. The phase shifter layer 34 can be deposited by a process such as chemical vapor deposition (CVD) or evaporation. The phase shifter layer 36 can be any transparent material that has an index of refraction with light that is different than the index of refraction for light with air. The phase shifter layer 36 is preferably an inorganic material that is transparent in the UV and deep UV regions.

Figure 3D:
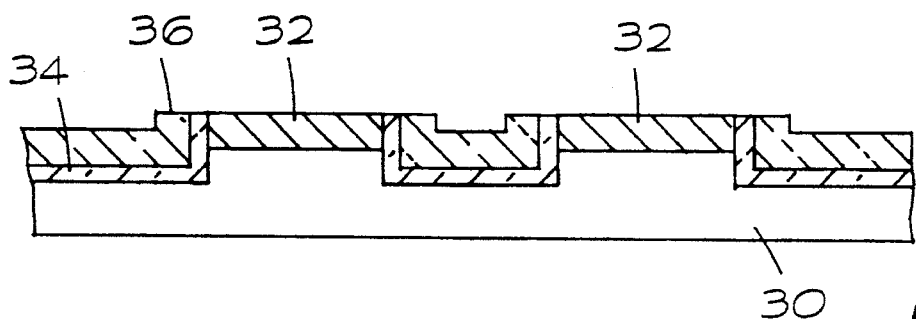
Figure 3D:
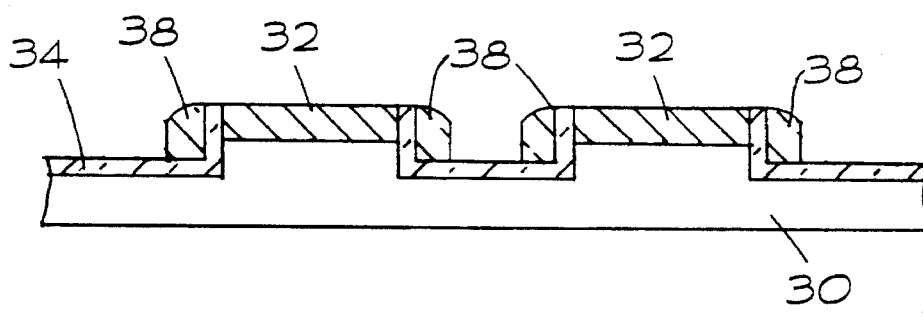

Following deposition of the phase shifter layer 36, the phase shifter layer 36 and the spacer layer 34 are planarized to expose the spacer layer 34 on the sidewalls 46 for etching. The planarization process endpoints along a plane that is coplanar to a surface of the opaque light blockers 32. The phase shifter layer 36 and spacer layer 34 can be planarized using chemical mechanical polishing (CMP) or using a dry etch process. FIG. 3D illustrates planarization using chemical mechanical polishing (CMP). FIG. 3DD illustrates planarization using a dry etch process.

As shown in FIG. 3D, using chemical mechanical polishing (CMP), the phase shifter layer 36 and spacer layer 34 are planarized and removed from the top of the opaque light blockers 32. This exposes the spacer layer 34 on the sidewalls 46 for etching in a subsequent step (FIG. 3D). With CMP the polishing mechanism is a combination of mechanical action and the chemical reaction of the material being polished with an aqueous colloidal silica solution. During the CMP, planarization can be to the surface of the opaque light blockers 32 or some of the material which forms the opaque light blockers 32 can also be planarized. In either case, the endpoint of the planarization process exposes the spacer layer for etching.

Alternately as shown in FIG. 3DD, a dry etch process can be used to planarize the phase shifter layer 36 and spacer layer 34 and to expose the spacer layers 34 for etching. This also removes the phase shifter layer 36 and spacer layer 34 over most of the substrate 30 except for spacers 38 formed on the sidewalls 46 (FIG. 3A). As will be apparent from the continuing description, the spacers 38 are subsequently formed into rim phase shifters. For a phase shifter layer 36 formed of a silicon containing material, such as $SiO_2$, the dry etch process shown in FIG. 3DD can include a chlorine or fluorine etchant species (e.g., $BCl_3$, $CCl_4$, $Cl_2$, $SiCl_4$). Other suitable etching species can be employed for other materials.

Figure 3E:
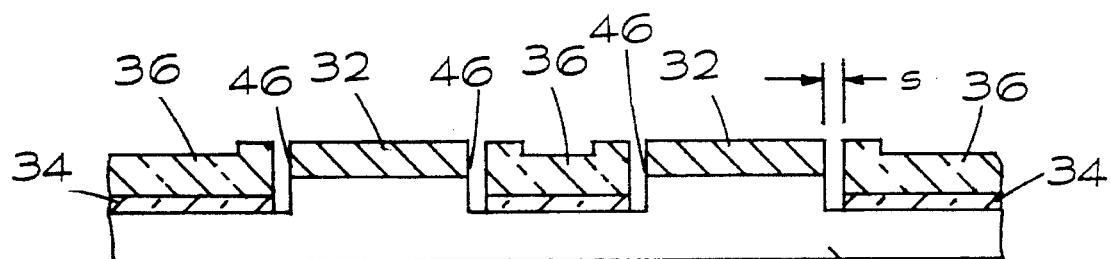

Next, as shown in FIG. 3E, the spacer layer 34 overlying the sidewalls 46 is removed by etching. The etch process is controlled to completely remove all of the spacer layer 34 not covered by the phase shifter layer 36. Since the spacer layer 34 is formed of a material that can be etched selectively with respect to the phase shifter layer 36, a suitable wet or dry etch process can be utilized to etch the spacer layer 34 from the sidewalls 46.

By way of example, a spacer layer 34 formed of silicon nitride ($Si_3N_4$) can be etched selectively with respect to a phase shifter layer 36 formed of silicon dioxide ($SiO_2$) using hot (e.g., 180° C.) phosphoric acid. The phosphoric acid will attack the silicon nitride and not the silicon dioxide or the quartz substrate.

In general, any two materials that can be etched selectively with respect to one another and which are transparent at the desired exposure wavelength for the mask can be used to form the spacer layer 34 and the phase shifter layer 36. Table 1 lists some possible materials for forming the spacer layer 34 and phase shifter layer 36 and suitable etchants.

By etching the spacer layer 34 from the sidewalls 46, the phase shifter layer 36 is separated from the edges of the opaque light blockers 32 by a gap 52 having a width "s". The width of the gap 52 is equal to the thickness T1 of the spacer layer 34. Since the spacer layer 34 can be formed accurately using conventional deposition processes, the gap 52 can also be accurately dimensioned.

Figure 3F:
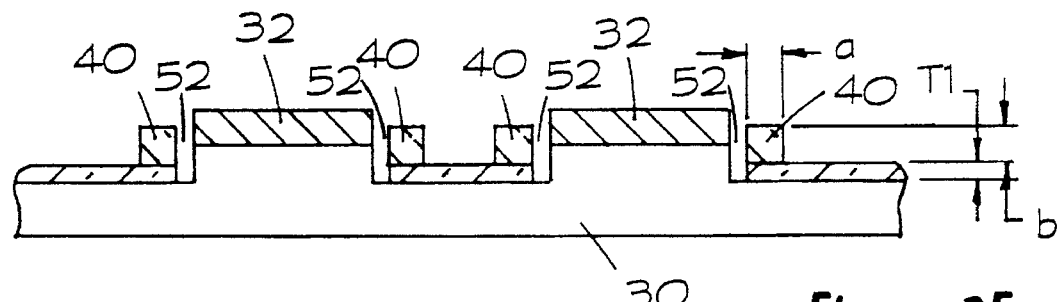

Next, as shown in FIG. 3F, the phase shifter layer 36 is etched to form rim phase shifters 40 on the sidewalls 46 of the opaque light blockers 32. The parameters of the etch process are controlled to form the rim phase shifters 40 with a desired width "a" and thickness "b". The phase shifter layer 36 can be etched using a suitable etching process (wet or dry). By way of example, a phase shifter layer 36 formed of $SiO_2$ can be etched using a fluorocarbon containing plasma.

The rim phase shifters 40 are separated from the edges of the opaque light blockers 32 by the gap "s" (FIG. 3E). The width "a" of the phase shifters 40 can also be accurately obtained by controlling the etching process parameters. In addition, the thickness "b" of the phase shifters 40, along with the thickness T1 of the spacer layer, are selected to provide a desired phase shift.

Figure 4:
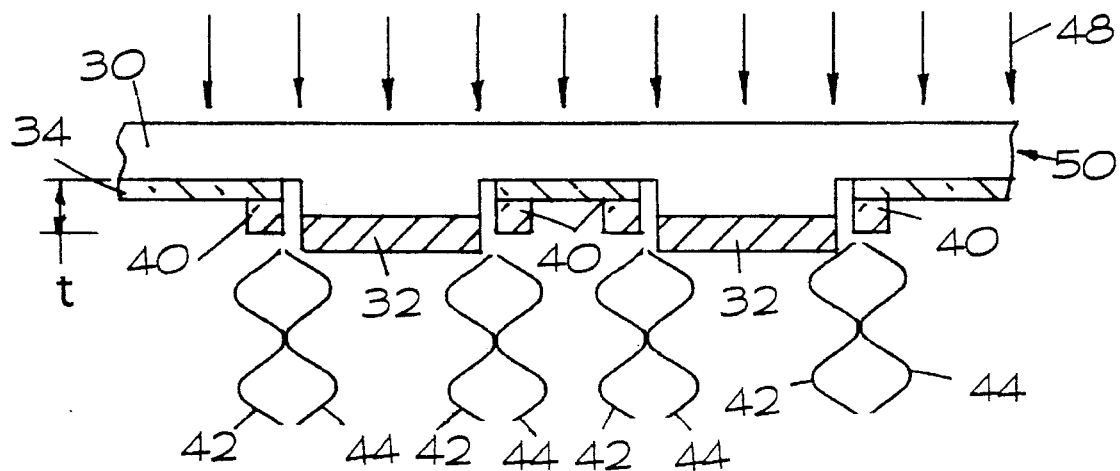
FIG. 4 is a schematic cross sectional view illustrating a portion of a rim phase shifting mask fabricated in accordance with the invention showing the phase shifting of light rays passing though rim phase shifters with respect to light rays not passed through the rim phase shifters.

Referring now to FIG. 4, the function of a phase shifter mask 50 constructed in accordance with the invention is shown. The phase shifter mask 50 is used in a photolithographic process wherein an exposure light 48 is directed through the mask 50 and onto a semiconductor wafer to be patterned (not shown). The features of the mask 50 are defined by the opaque light blockers 32 and light transmission openings 33 (FIG. 3A). A phase shifter 40 is located along each sidewall 46 (FIG. 3E) of the opaque light blocker 32. The phase shifters 40 are thus self aligned with the features defined by the opaque light blockers 32. A light ray 42 diffracted from the edges of an opaque light blocker 32 will be 180° ($\pi$) out of phase with a light ray 44 passing through a phase shifter 40. This creates an intense null on the wafer at the edge of the feature and clearly delineates the feature.

The amount of the phase shift produced by the phase shifters 40 is a function of the index of refraction of the materials used for the spacer layer 34 and phase shifter layer 36 (FIG. 3E). In addition, the amount of the phase shift is a function of the height of the phase shifters 40 "t". This total height "t" is equal to the thickness b of the phase shifters and the thickness T1 of the spacer layer (t=b+T1). The previously cited formula can be used to determine the amount of the phase shift.

Thus $$t=i\lambda/2(n-1)$$

where in this case
t=total height of rim phase shifters
i=an odd integer
λ=wavelength of exposure light
n=refractive index of phase shift material and the spacer material at the exposure wavelength.

Thus the present invention provides an improved method for forming a rim phase shifting mask useful for photolithographic processes in semiconductor manufacture. With the method of the invention phase shifters can be formed with an accurate width, thickness and spacing by the conformable deposition and selective etching of different layers of transparent material.

While the method of the invention has been described with reference to certain preferred embodiments, as will be apparent to those skilled in the art, certain changes and modifications can be made without departing from the scope of the invention as defined by the following claims.

What is claimed:

1. A method for forming a rim phase shifting mask comprising:

providing a transparent substrate;

forming opaque light blockers with sidewalls and light transmission openings there between on the substrate;

forming a first layer of material over the substrate, and over the light blockers and the sidewalls thereof, said first layer of material formed of a transparent material of a predetermined thickness;

forming a second layer of material on the first layer of material said second layer of material formed of a transparent material;

exposing the first layer of material on the sidewalls;

etching the first layer selectively with respect to the second layer to remove the first layer of material from the sidewalls; and etching the second layer of material to form phase shifters spaced from the sidewalls by the thickness of the first layer of material and having a predetermined width and height.

2. The method as recited in claim 1 and wherein the first and second layer are exposed using chemical mechanical polishing.

3. The method as recited in claim 1 and wherein the first and second layer are exposed using a dry etch process.

4. The method as recited in claim 1 and wherein the first layer is formed of a material selected from the group consisting of $SiO_2$, $Si_3N_4$, $AlO_2$, $TiO_2$, tetraethylorthosilicate, doped glass, $CaF_2$, $MgF_2$, and polymethyl methacrylate.

5. The method as recited in claim 1 and wherein the second layer is formed of a material selected from the group consisting of $SiO_2$, $Si_3N_4$, $AlO_2$, $TiO_2$, tetraethylorthosilicate, doped glass, $CaF_2$, $MgF_2$, and polymethyl methacrylate.

6. The method as recited in claim 1 and wherein the first layer is $Si_3N_4$ and the second layer is $SiO_2$.

7. The method as recited in claim 1 and further comprising etching the substrate to a predetermined depth to form vertical portions coplanar with the sidewalls of the opaque light blockers.

8. A method for forming a rim phase shifting mask comprising:

providing a transparent substrate;

forming an opaque layer on the transparent substrate having opaque light blockers with sidewalls and light transmission openings there between;

depositing a first layer of material over the substrate and the sidewalls of the opaque light blockers, said first layer of material formed of a transparent material having a predetermined thickness;

depositing a second layer of material on the first layer of material, said second layer of material formed of a transparent material;

planarizing the first and second layer of material to expose the first layer of material on the sidewalls;

etching the first layer selectively with respect to the second layer to remove the first layer of material from the sidewalls and to form a gap between the sidewalls of the opaque layer and the second layer of material; and etching the second layer of material to form phase shifters spaced from the sidewalls by the gap and having a predetermined width and height.

9. The method as recited in claim 8 and wherein the first and second layers are planarized using chemical mechanical polishing.

10. The method as recited in claim 8 and wherein the first and second layers are planarized using a dry etch process.

11. The method as recited in claim 8 and further comprising etching the substrate to a predetermined depth to form vertical portions coplanar with the sidewalls of the opaque light blockers.

12. The method as recited in claim 8 and wherein a total thickness of the phase shifters is selected to achieve a phase shift of π or odd multiple thereof for light passing through the phase shifters relative to light diffracted from the sidewalls of the opaque light blockers.

13. The method as recited in claim 8 and wherein a total height of the phase shifters is given by the formula $$t=i\lambda/2(n-1)$$

where
t=total height of phase shifters
i=an odd integer
λ=wavelength of exposure light
n=refractive index of first and second layer of material at an exposure wavelength.

14. A method for forming a rim phase shifting mask comprising:

providing a transparent substrate;

forming an opaque layer on the transparent substrate having opaque light blockers with sidewalls and light transmission openings there between;

conformally depositing a spacer layer over the substrate and the sidewalls of the opaque light blockers, said spacer layer formed of a transparent material having a predetermined thickness;

conformally depositing a phase shifter layer on the spacer layer, said phase shifter layer formed of a transparent material;

planarizing the spacer layer and the phase shifter layer to expose the spacer layer on the sidewalls;

etching the spacer layer selectively with respect to the phase shifter layer to remove the spacer layer from the sidewalls and form a gap between the sidewalls and phase shifter layer, said gap formed with a width equal to the predetermined thickness of the spacer layer; and etching the phase shifter layer to form rim phase shifters spaced from the sidewalls by the width of the gap and having a predetermined width and height.

15. The method as recited in claim 14 and wherein planarizing the spacer layer and phase shifter layer is with chemical mechanical polishing.

16. The method as recited in claim 14 and wherein planarizing the spacer layer and phase shifter layer is with dry etching.

17. The method as recited in claim 14 and wherein the spacer layer is a material selected from the group of materials consisting of $SiO_2$, $Si_3N_4$, $AlO_2$, $TiO_2$, tetraethylorthosilicate, doped glass, $CaF_2$, $MgF_2$, and polymethyl methacrylate.

18. The method as recited in claim 14 and wherein the phase shifting layer is selected from the group of materials consisting of $SiO_2$, $Si_3N_4$, $AlO_2$, $TiO_2$, tetraethylorthosilicate, doped glass, $CaF_2$, $MgF_2$, and polymethyl methacrylate.

19. The method as recited in claim 14 and further comprising etching the substrate to a predetermined depth to form vertical portions coplanar with the sidewalls of the opaque light blockers.

20. A phase shift mask formed by the method recited in claim 14.

* * * * *